United States Patent
Ueda

[11] Patent Number: 6,124,181
[45] Date of Patent: Sep. 26, 2000

[54] METHOD FOR MANUFACTURING BIPOLAR TRANSISTOR CAPABLE OF SUPPRESSING DETERIORATION OF TRANSISTOR CHARACTERISTICS

[75] Inventor: Yuu Ueda, Yamagata, Japan

[73] Assignee: NEC Corporation, Tokyo, Japan

[21] Appl. No.: 09/281,286

[22] Filed: Mar. 30, 1999

[30] Foreign Application Priority Data

Mar. 30, 1998 [JP] Japan ................................ 10-084713

[51] Int. Cl.$^7$ ................................................. H01L 21/331
[52] U.S. Cl. ........................... 438/350; 438/365; 438/756
[58] Field of Search ................................... 438/309, 365, 438/366, 368, 745, 756

[56] References Cited

U.S. PATENT DOCUMENTS

| | | |
|---|---|---|
| 5,523,244 | 6/1996 | Vu et al. . |
| 5,523,245 | 6/1996 | Imai . |

FOREIGN PATENT DOCUMENTS

| | | |
|---|---|---|
| 0768716 A2 | 4/1997 | European Pat. Off. . |
| 62-169364 | 7/1987 | Japan . |
| 4-122029 | 4/1992 | Japan . |
| 4-192335 | 7/1992 | Japan . |
| 6-69217 | 3/1994 | Japan . |
| 6-168951 | 6/1994 | Japan . |
| 6-275633 | 9/1994 | Japan . |
| 7-66214 | 3/1995 | Japan . |

*Primary Examiner*—Tuan H. Nguyen
*Attorney, Agent, or Firm*—McGinn & Gibb, P.C.

[57] ABSTRACT

In a method for manufacturing a bipolar transistor, a first insulating layer, a first polycrystalline silicon layer of a second conductivity type, and a second insulating layer are sequentially formed on a semiconductor substrate of a first conductivity type. Then, the second insulating layer and the first polycrystalline silicon layer are patterned to form an opening therein. Then, the first insulating layer is over etched by using the second insulating layer and the first polycrystalline silicon layer as a mask. Then, a second polycrystalline silicon layer is formed on the entire surface. Then, an oxidizing process is performed upon the second polycrystalline silicon layer except for a part of the second polycrystalline silicon layer under the first polycrystalline silicon layer, and the oxidized part of the second polycrystalline silicon layer is removed by a wet etching process. Then, impurities of the second conductivity type are implanted into the semiconductor substrate to form a base region. Then, a sidewall insulating layer is formed on a sidewall of the first and second polycrystalline silicon layers. Then, a third polycrystalline silicon layer of the first conductivity type is formed on the base region. Finally, an annealing operation is carried out. As a result, impurities of the second conductivity type are diffused from the first polycrystalline silicon layer via the second polycrystalline silicon into the semiconductor substrate to form a graft base region, and impurities of the first conductivity type are diffused from the third polycrystalline silicon layer into the base region to form an emitter region.

6 Claims, 8 Drawing Sheets

METHOD FOR MANUFACTURING BIPOLAR TRANSISTOR CAPABLE OF SUPPRESSING DETERIORATION OF TRANSISTOR CHARACTERISTICS

BACKGROUND OF THE INVENTION

1. Field of the Invention

The present invention relates to a method for manufacturing a bipolar transistor.

2. Description of the Related Art

In a first prior art method for manufacturing a bipolar transistor, a first insulating layer, a first polycrystalline silicon layer of a second conductivity type and a second insulating layer are sequentially formed on a semiconductor substrate of a first conductivity type. Then, the second insulating layer and the first polycrystalline silicon layer are patterned to form an opening therein. Then, the first insulating layer is overetched by using the second insulating layer and the first polycrystalline silicon layer as a mask. Then, a second polycrystalline silicon layer is formed on the entire surface. Then, the second polycrystalline silicon layer except for a part of the second polycrystalline silicon layer under the first polycrystalline silicon layer is etched by an isotropic etching process. Then, impurities of the second conductivity type are implanted into the semiconductor substrate to form a base region. Then, a sidewall insulating layer is formed on a sidewall of the first and second polycrystalline silicon layers. Then, a third polycrystalline silicon layer of the first conductivity type is formed on the base region. Finally, an annealing operation is carried out. As a result, impurities of the second conductivity type are diffused from the first polycrystalline silicon layer via the second polycrystalline silicon layer into the semiconductor substrate to form a graft base region, and impurities of the first conductivity type are diffused from the third polycrystalline silicon layer into the base region to form an emitter region. This will be explained later in detail.

In the above-described first prior art method, however, since the semiconductor substrate is also etched at the isotropic etching process for etching the second polycrystalline silicon layer, the transistor characteristics are deteriorated. For example, a leakage current may be increased, and also the graft base region cannot be electrically connected to the base layer which increases the base resistance.

In a second prior art method for manufacturing a bipolar transistor, the second polycrystalline silicon layer of the first prior art method is oxidized, and the oxidized part thereof is removed by a dry etching process (see JP-A-62-169364).

In the above-described second prior art method, however, since the semiconductor substrate is damaged by the dry etching process for removing the oxidized part of the second polycrystalline silicon layer, the transistor characteristics are still deteriorated.

SUMMARY OF THE INVENTION

It is an object of the present invention to suppress the deterioration of the characteristics of a bipolar transistor.

According to the present invention, in a method for manufacturing a bipolar transistor, a first insulating layer, a first polycrystalline silicon layer of a second conductivity type and a second insulating layer are sequentially formed on a semiconductor substrate of a first conductivity type. Then, the second insulating layer and the first polycrystalline silicon layer are patterned to form an opening therein. Then, the first insulating layer is overetched by using the second insulating layer and the first polycrystalline silicon layer as a mask. Then, a second polycrystalline silicon layer is formed on the entire surface. Then, an oxidizing process is performed upon the second polycrystalline silicon layer except for a part of the second polycrystalline silicon layer under the first polycrystalline silicon layer, and the oxidized part of the second polycrystalline silicon layer is removed by a wet etching process. Then, impurities of the second conductivity type are implanted into the semiconductor substrate to form a base region. Then, a sidewall insulating layer is formed on a sidewall of the first and second polycrystalline silicon layers. Then, a third polycrystalline silicon layer of the first conductivity type is formed on the base region. Finally, an annealing operation is carried out. As a result, impurities of the second conductivity type are diffused from the first polycrystalline silicon layer via the second polycrystalline silicon layer into the semiconductor substrate to form a graft base region, and impurities of the first conductivity type are diffused from the third polycrystalline silicon layer into the base region to form an emitter region. Thus, since the semiconductor substrate is hardly etched at the wet etching process for etching the second polycrystalline silicon layer, the transistor characteristics are hardly deteriorated.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, a prior art method for manufacturing a bipolar transistor will be explained with reference to FIGS. 1A through 1K.

Figure 1A:
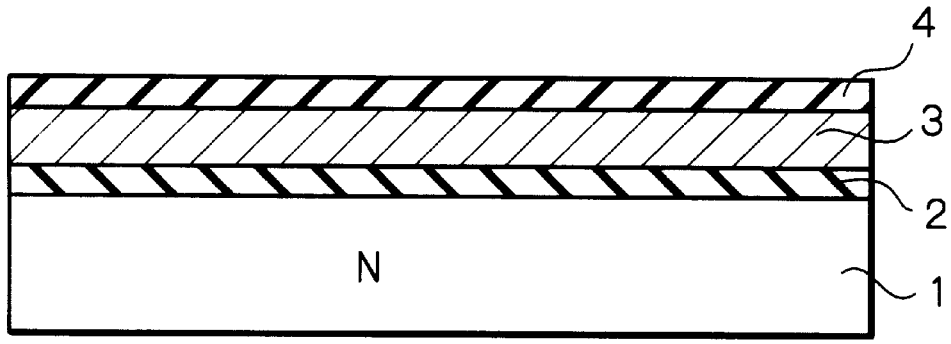
FIGS. 1A through 1K are cross-sectional views for explaining a prior art method for manufacturing a bipolar transistor.

First, referring to FIG. 1A, an oxidation process is performed upon an N-type monocrystalline substrate 1 to form a silicon oxide layer 2. Then, a boron-doped polycrystalline silicon layer 3 is deposited on the silicon oxide layer 2. Then, a silicon nitride layer 4 is deposited on the boron-doped polycrystalline silicon layer 3.

Figure 1B:
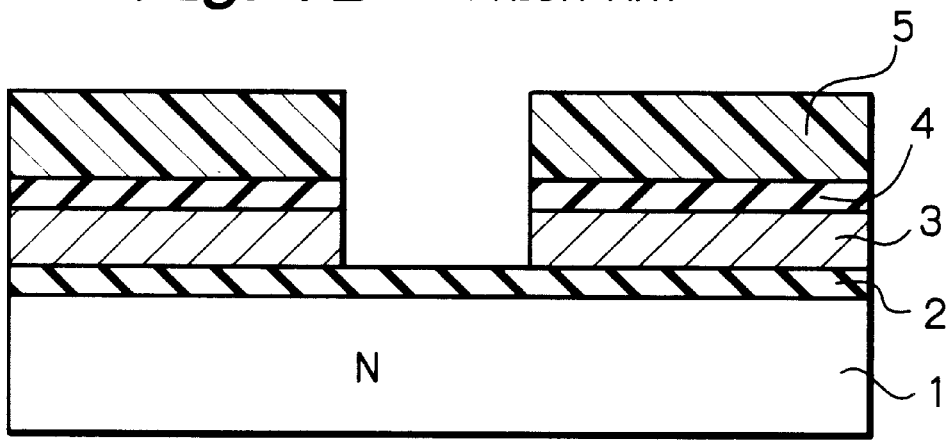

Next, referring to FIG. 1B, a photoresist pattern layer 5 is formed on the silicon nitride layer 4 by using a photolithography process. Then, the silicon nitride layer 4 and the boron-doped polycrystalline silicon layer 3 are etched by a dry etching process using the photoresist pattern layer 5 as a mask. Thus, an opening is perforated within the silicon nitride layer 4 and the boron-doped polycrystalline silicon layer 2. Then, the photoresist pattern layer 5 is removed.

Figure 1C:
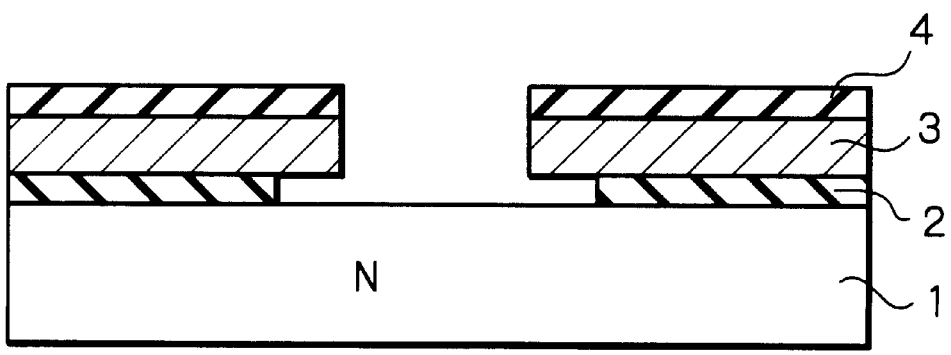

Next, referring to FIG. 1C, the silicon oxide layer 2 is side-etched by a wet etching process using the silicon nitride layer 4 and the boron-doped polycrystalline silicon layer 3 as a mask.

Figure 1D:
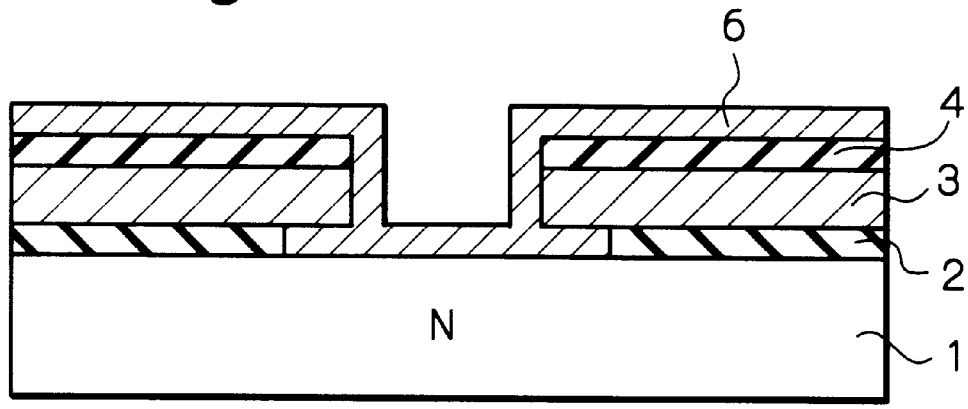

Next, referring to FIG. 1D, a non-doped polycrystalline silicon layer 6 is deposited on the entire surface.

Figure 1E:
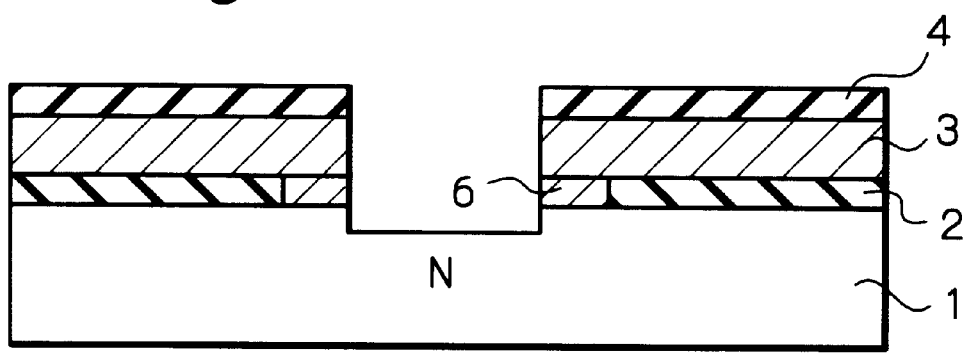

Next, referring to FIG. 1E, the non-doped polycrystalline silicon layer 6 is etched back by an isotropic etching process. As a result, the non-doped polycrystalline silicon layer 6 is left only on the sidewalls of the silicon oxide layer 2. In this case, an about 300 to 2000 Å thickness of the monocrystalline silicon substrate 1 is also etched.

Figure 1F:
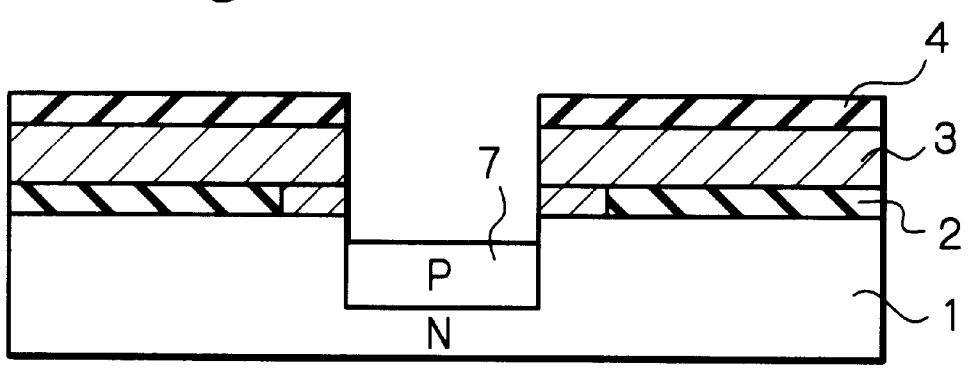

Next, referring to FIG. 1F, boron ions are implanted into the monocrystalline silicon substrate 1 by using the silicon nitride layer 4 as a mask. As a result, a P-type base layer 7 is formed within the monocrystalline silicon substrate 1.

Figure 1G:
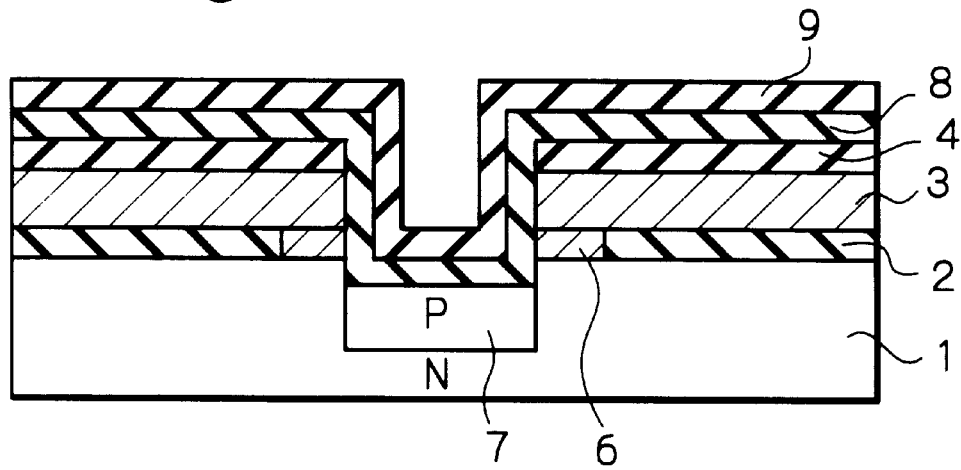

Next, referring to FIG. 1G, a silicon oxide layer 8 and a silicon nitride layer 9 are sequentially deposited on the entire surface.

Figure 1H:
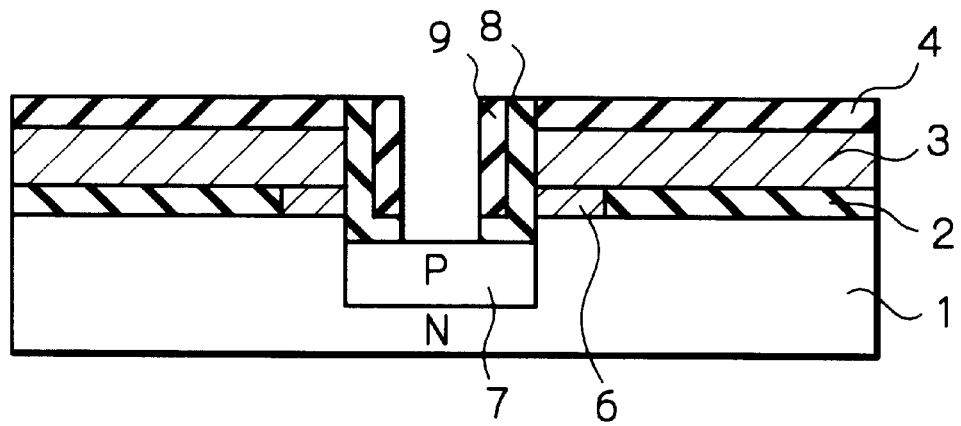

Next, referring to FIG. 1H, the silicon nitride layer 9 is etched back by a dry etching process, and thereafter, the silicon oxide layer 8 is etched by a wet etching process. As a result, a sidewall insulating layer is formed by the silicon oxide layer 8 and the silicon nitride layer 9.

Figure 1I:
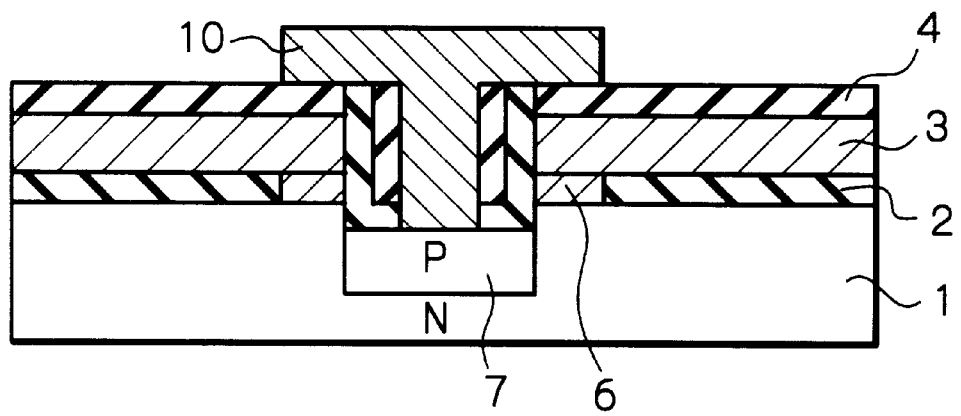

Next, referring to FIG. 1I, a polycrystalline silicon layer 10 is deposited on the entire surface, and then, arsenic ions are implated into the polycrystalline silicon layer 10. Then, the polycrystalline silicon layer 10 is patterned by a photolithography and etching process. As a result, the arsenic-doped polycrystalline silicon layer 10 is formed.

Figure 1J:
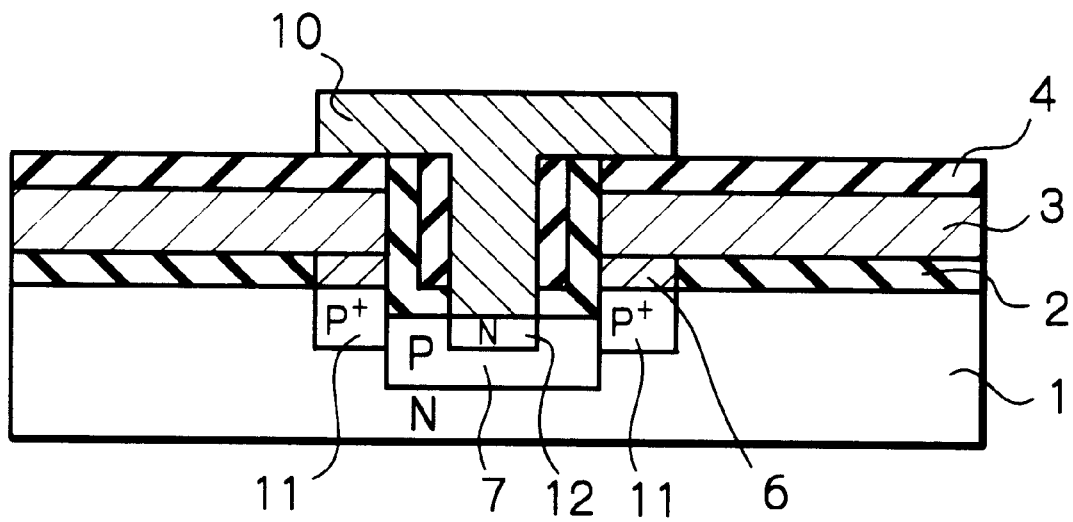

Next, referring to FIG. 1J, an annealing operation is carried out. As a result, boron ions are diffused from the boron-doped polycrystalline silicon layer 3 via the non-doped polycrystalline silicon layer 6 to the monocrystalline silicon substrate 1, to thereby form a $P^+$-type graft base region 11 within the monocrystalline silicon substrate 1. Simultaneously, arsenic ions are diffused from the arsenic-doped polycrystalline silicon layer 10 to the P-type base layer 7, to thereby form an N-type emitter region 12 within the P-type base layer 7.

Figure 1K:
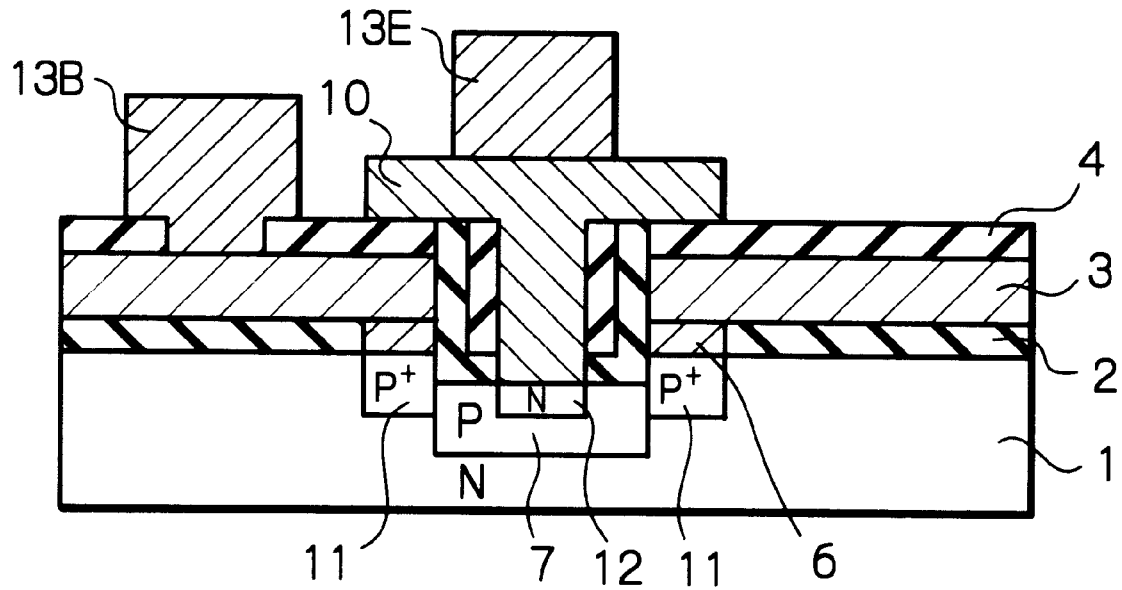

Finally, referring to FIG. 1K, an emitter electrode 13E and a base electrode 13B are formed. Note that the base electrode 13B is connected via the polycrystalline silicon layers 3 and 6 to the graft base region 11. Thus, an NPN-type transistor having the monocrystalline silicon substrate 1 as a collector connected to a collector electrode (not shown) is completed.

In the method as illustrated in FIGS. 1A through 1K, however, since the monocrystalline silicon substrate 1 is also etched at the isotropic etching process for etching the non-doped polycrystalline silicon layer 6, the transistor characteristics are deteriorated. For example, a leakage current may be increased, and also the $P^+$-type graft base region 11 cannot be electrically connected to the P-type base layer 7 which increases the base resistance.

An embodiment of the method for manufacturing a bipolar transistor according to the present invention will be explained next with reference to FIGS. 2A through 2K.

Figure 2A:
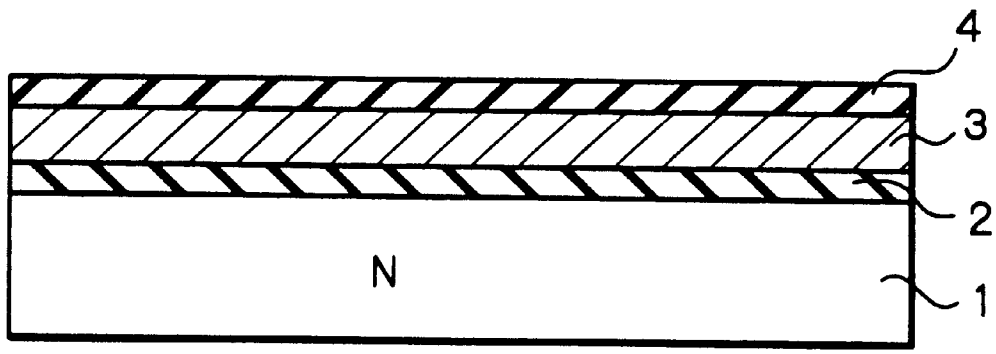
FIGS. 2A through 2L are cross-sectional views for explaining an embodiment of the method for manufacturing a bipolar transistor according to the present invention.

First, referring to FIG. 2A, in the same way as in FIG. 1A, an oxidation process is performed upon an N-type monocrystalline substrate 1 to form an about 200 to 1000 Å thick silicon oxide layer 2. Then, an about 1000 to 3000 Å thick boron-doped polycrystalline silicon layer 3 is deposited on the silicon oxide layer 2. Then, an 500 to 3000 Å thick silicon nitride layer 4 is deposited on the boron-doped polycrystalline silicon layer 3.

Figure 2B:
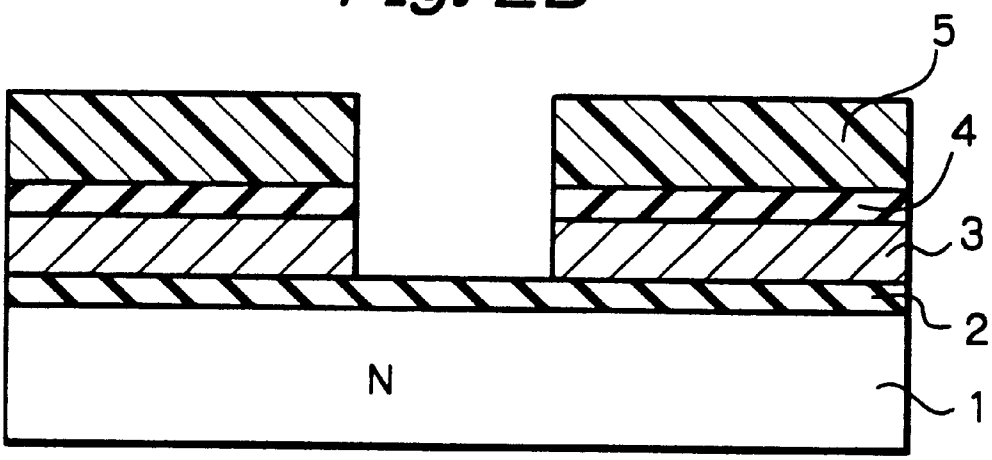

Next, referring to FIG. 2B, in the same way as in FIG. 1B, an about 1 μm thick photoresist pattern layer 5 is formed on the silicon nitride layer 4 by using a photolithography process. Then, the silicon nitride layer 4 and the boron-doped polycrystalline silicon layer 3 are etched by a dry etching process using the photoresist pattern layer 5 as a mask. Thus, an opening is perforated within the silicon nitride layer 4 and the boron-doped polycrystalline silicon layer 2. Then, the photoresist pattern layer 5 is removed.

Figure 2C:
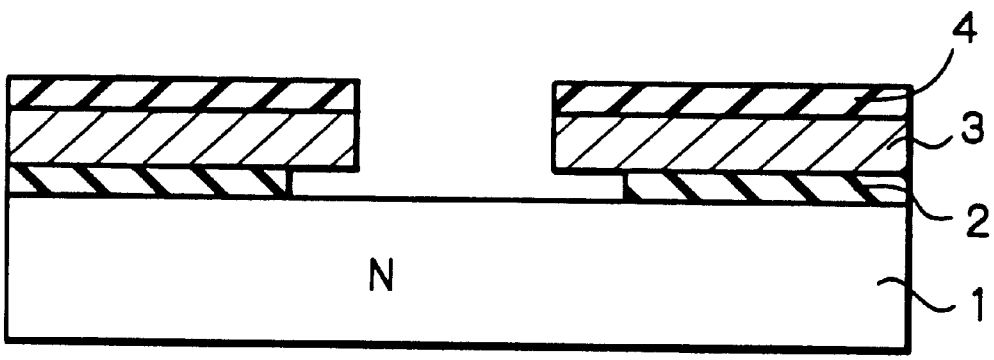

Next, referring to FIG. 2C, in the same way as in FIG. 1C, as about 1000 to 3000 Å thickness of the silicon oxide layer 2 is side-etched by a wet etching process using the silicon nitride layer 4 and the boron-doped polycrystalline silicon layer 3 as a mask.

Figure 2D:
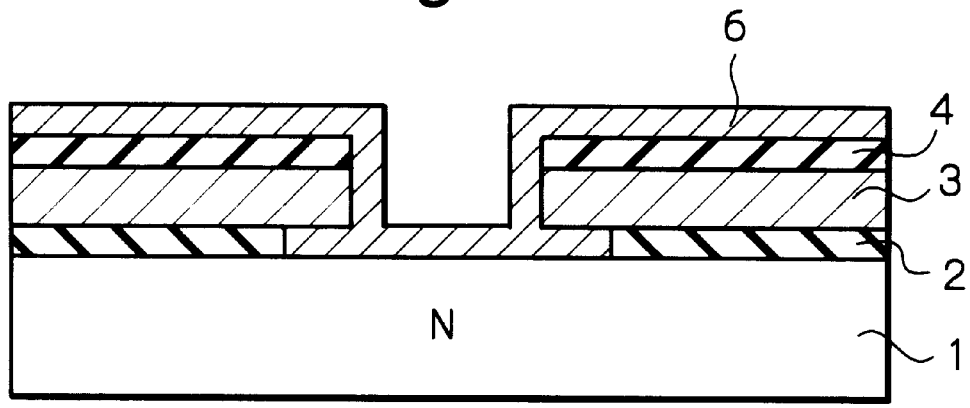

Next, referring to FIG. 2D, in the same way as in FIG. 1D, an about 200 to 1000 Å thick non-doped polycrystalline silicon layer 6 is deposited on the entire surface.

Figure 2E:
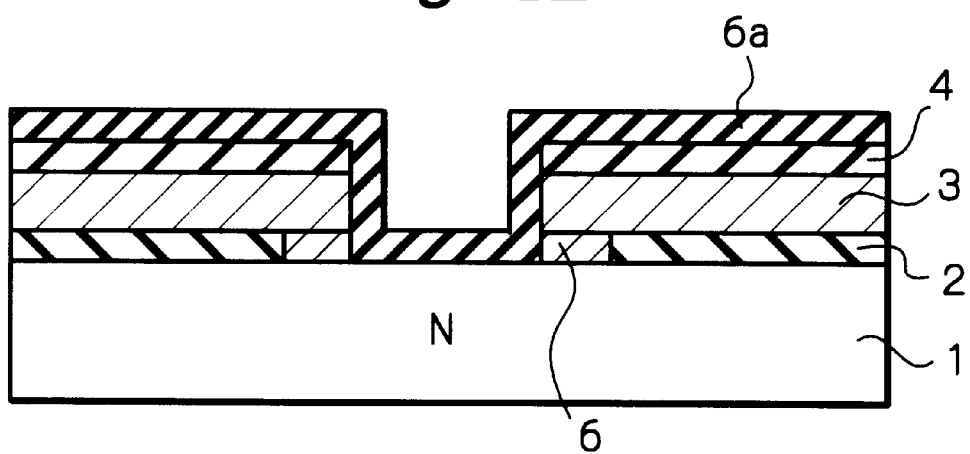

Next, referring to FIG. 2E, an oxidation process is carried out. As a result, an exposed part of the non-doped polycrystalline silicon layer 6 is converted into a silicon oxide layer 6a.

Figure 2F:
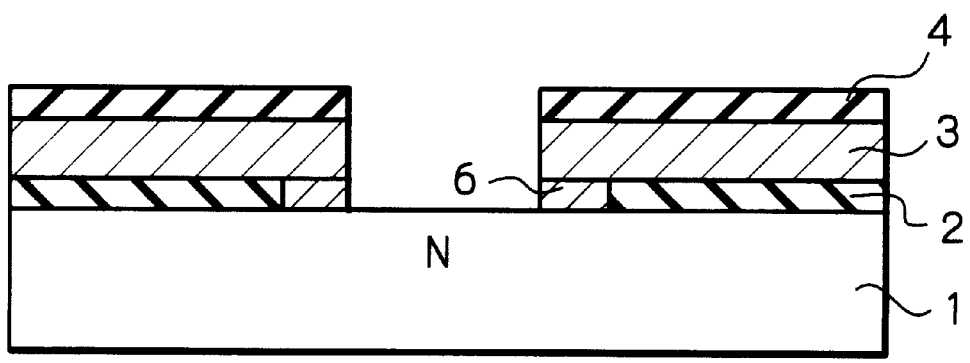

Next, referring to FIG. 2F, the silicon oxide layer 6a is etched by a wet etching process using hydrogen fluoride. As a result, the non-doped polycrystalline silicon layer 6 is left only on the sidewalls of the silicon oxide layer 2. Note that in this case, the monocrystallines silicon substrate 1 is hardly etched.

Figure 2G:
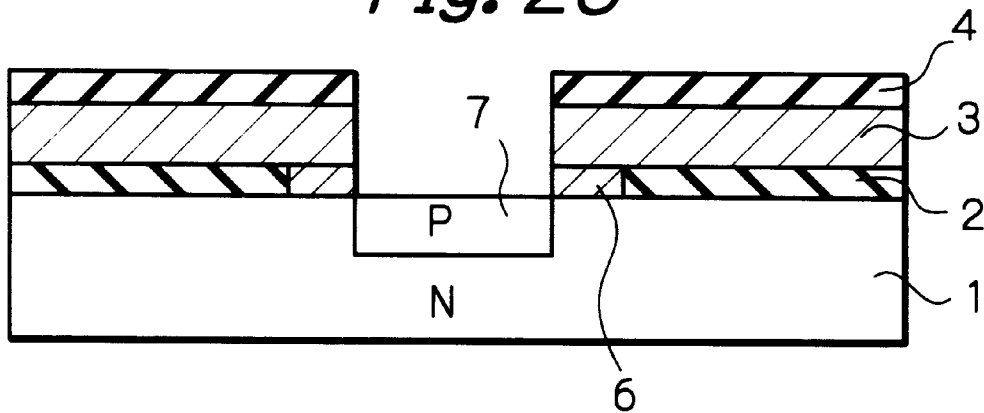

Next, referring to FIG. 2G, in the same way as in FIG. 1F, boron ions are implanted into the monocrystalline silicon substrate 1 by using the silicon nitride layer 4 as a mask. As a result, a P-type base layer 7 is formed within the monocrystalline silicon substrate 1.

Figure 2H:
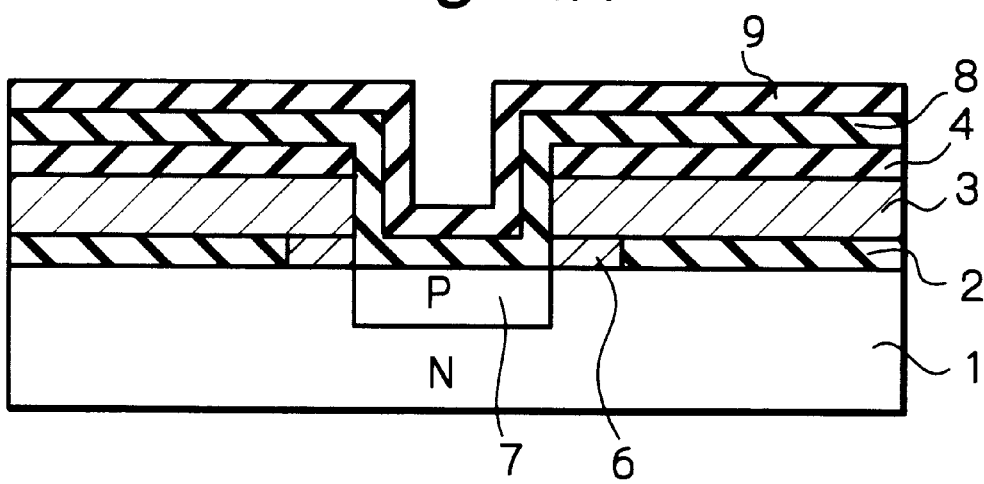

Next, referring to FIG. 2H, in the same way as in FIG. 1G, an about 200 to 1000 Å thick silicon oxide layer 8 and an about 500 to 3000 Å thick silicon nitride layer 9 are sequentially deposited on the entire surface.

Figure 2I:
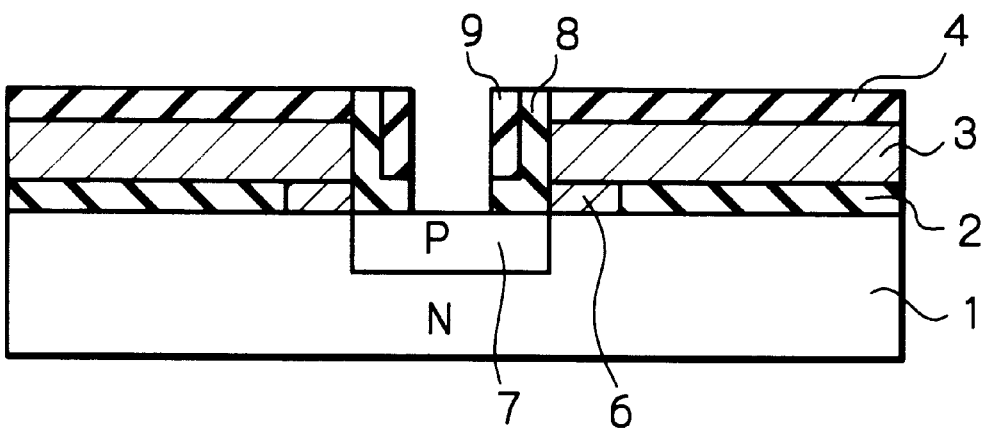

Next, referring to FIG. 2I, in the same way as in FIG. 1H, the silicon nitride layer 9 is etched back by a dry etching process, and thereafter, the silicon oxide layer 8 is etched by a wet etching process. As a result, a sidewall insulating layer is formed by the silicon oxide layer 8 and the silicon nitride layer 9.

Figure 2J:
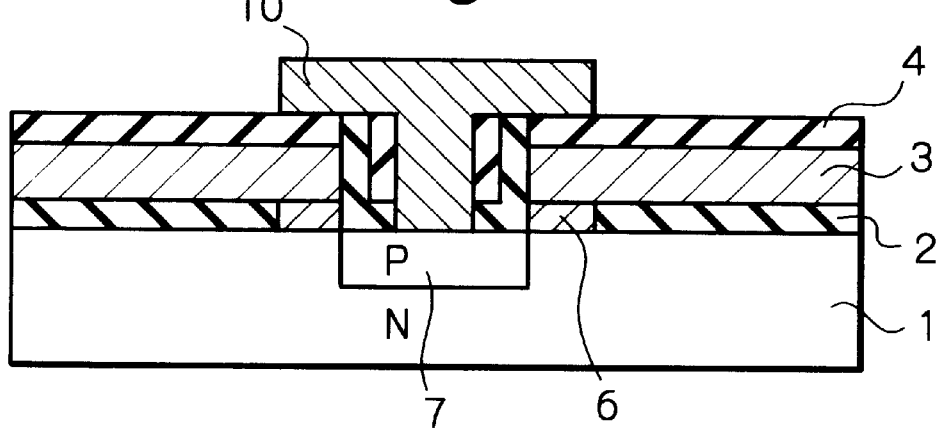

Next, referring to FIG. 2J, in the same way as in FIG. 1I, an about 1000 to 3000 Å thick polycrystalline silicon layer 10 is deposited on the entire surface, and then, arsenic ions are implanted into the polycrystalline silicon layer 10. Then, the polycrystalline silicon layer 10 is patterned by a photolithography and etching process. As a result, the arsenic-doped polycrystalline silicon layer 10 is formed.

Figure 2K:
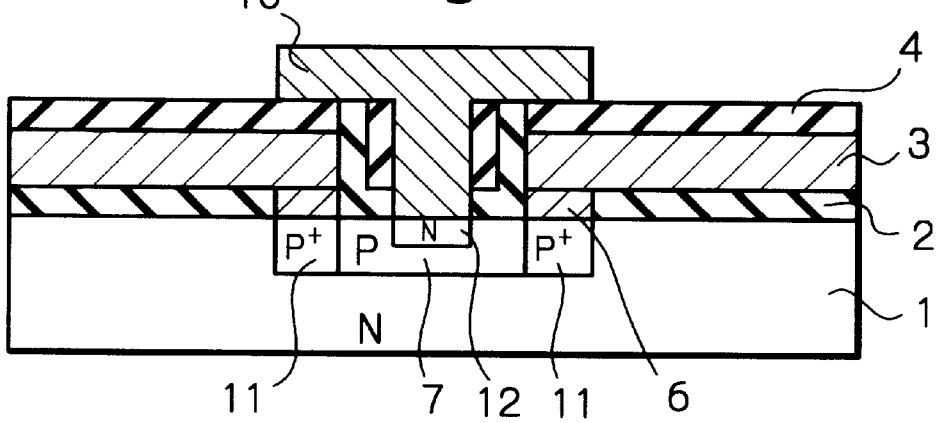

Next, referring to FIG. 2K, in the same way as in FIG. 1J, an annealing operation to a temperature of about 700 to 1200° C. is carried out. As a result, boron ions are diffused from the boron-doped polycrystalline silicon layer 3 via the non-doped polycrystalline silicon layer 6 to the monocrystalline silicon substrate 1, to thereby form a $P^+$-type graft base region 11 within the monocrystalline silicon substrate 1. Simultaneously, arsenic ions are diffused from the arsenic-doped polycrystalline silicon layer 10 to the P-type base layer 7, to thereby form an N-type emitter region 12 within the P-type base layer 7.

Figure 2L:
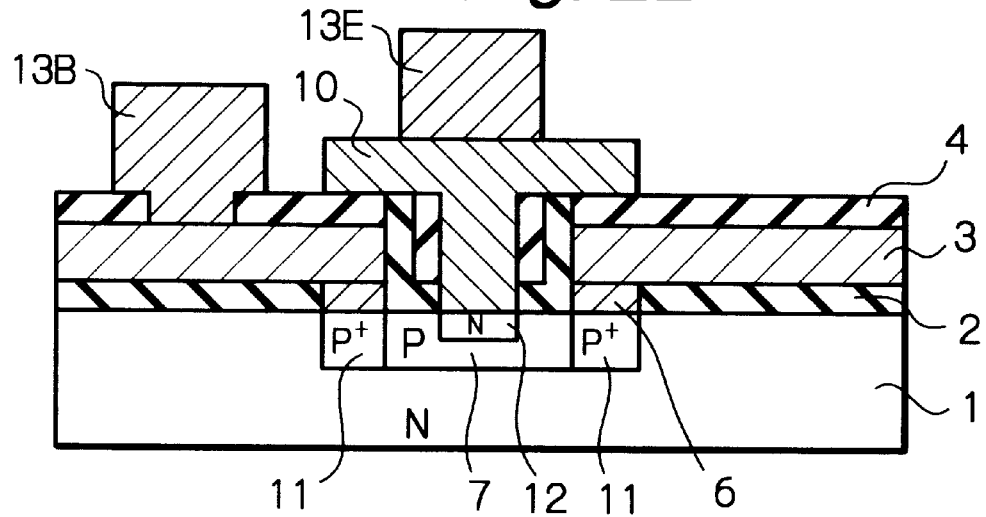

Finally, referring to FIG. 2L, in the same way as in FIG. 1K, an emitter electrode 13E and a base electrode 13B are formed. Note that the base electrode 13B is connected via the polycrystalline silicon layers 3 and 6 to the graft base region 11. Thus, an NPN-type transistor having the monocrystalline silicon substrate 1 as a collector connected to a collector electrode (not shown) is completed.

In the method as illustrated in FIGS. 2A through 2L, since the monocrystalline silicon substrate 1 is hardly etched at the wet etching process for etching the non-doped polycrystalline silicon layer 6, the transistor characteristics are hardly deteriorated. Therefore, a leakage current can be suppressed, and also the $P^+$-type graft base region 11 can be surely connected to the P-type base layer 7 which suppresses the increase of the base resistance.

In the above-described embodiment, the introduction of impurity ions into the polycrystalline silicon layers 3 and 10 can be carried out simultaneously with the growth thereof or by the ion implantation after the growth thereof.

Also, since the non-doped polycrystalline silicon layer 6 is removed by an oxidation process and a wet etching process, not by a dry etching process, the manufacturing cost can be dereased.

Note that the present invention can also be applied to a collector-buried-layer type bipolar transistor where a pull-out collector electrode is formed on the front surface of a monocrystalline silicon substrate. In addition, the present invention can be applied to a method for manufacturing a PNP-type transistor.

As explained hereinabove, according to the present invention, since a semiconductor substrate is hardly etched at the removal process of non-doped polycrystalline silicon, the deterioration of transistor characteristics can be suppressed.

What is claimed is:

1. A method for manufacturing a bipolar transistor, comprising:

forming a first insulating layer on a semiconductor substrate of a first conductivity type;

forming a first polycrystalline silicon layer of a second conductivity type on said first insulating layer;

forming a second insulating layer on said first polycrystalline silicon layer;

patterning said second insulating layer and said first polycrystalline silicon layer to form an opening within said second insulating layer and said first polycrystalline silicon layer;

overetching said first insulating layer by using said second insulating layer and said first polycrystalline silicon layer as a mask after said opening is formed;

forming a second polycrystalline silicon layer on a exposed entire surface of said semiconductor substrate, said first and second insulating layers and said first polycrystalline silicon layer after said first insulating layer is overetched;

performing an oxidizing process upon said second polycrystalline silicon layer except for a part of said second polycrystalline silicon layer under said first polycrystalline silicon layer;

removing an oxidized part of said second polycrystalline silicon layer by a wet etching process;

implanting impurities of said second conductivity type into said semiconductor substrate to form a base region within said semiconductor substrate after the oxidized part of said second polycrystalline silicon layer is removed;

forming a sidewall insulating layer on a sidewall of said first and second polycrystalline silicon layers after said base region is formed;

forming a third polycrystalline silicon layer of said first conductivity type on said base region of said semiconductor substrate after said sidewall layer is formed; and carrying out an annealing operation, so that impurities of said second conductivity type are diffused from said first polycrystalline silicon layer via said second polycrystalline silicon layer into said semiconductor substrate to form a graft base region within said semiconductor substrate and impurities of said first conductivity type are diffused from said third polycrystalline silicon layer into said base region of said semiconductor substrate to form an emitter region within said base region.

2. The method as set forth in claim 1, wherein said second polycrystalline silicon layer is non-doped.

3. The method as set forth in claim 1, wherein said semiconductor substrate is made of monocrystalline silicon.

4. The method as set forth in claim 1, wherein said first insulating layer is made of silicon oxide.

5. The method as set forth in claim 1, wherein said second insulating layer is made of silicon nitride.

6. The method as set forth in claim 1, wherein said sidewall insulating layer comprises a stacked layer of silicon oxide and silicon nitride.

* * * * *